United States Patent
Shiang et al.

(10) Patent No.: US 8,940,411 B2
(45) Date of Patent: Jan. 27, 2015

(54) MATERIALS FOR OPTOELECTRONIC DEVICES

(75) Inventors: Joseph John Shiang, Niskayuna, NY (US); Paul Michael Smigelski, Jr., Glenville, NY (US)

(73) Assignee: General Electric Company, Niskayuna, NY (US)

( * ) Notice: Subject to any disclaimer, the term of this patent is extended or adjusted under 35 U.S.C. 154(b) by 889 days.

(21) Appl. No.: 13/093,038

(22) Filed: Apr. 25, 2011

(65) Prior Publication Data

US 2012/0267574 A1  Oct. 25, 2012

(51) Int. Cl.
| | | |
|---|---|---|
| H01L 51/54 | (2006.01) |
| C09K 11/06 | (2006.01) |
| C08G 75/32 | (2006.01) |
| C07C 43/205 | (2006.01) |
| C08G 79/00 | (2006.01) |
| C08G 61/12 | (2006.01) |
| H01L 51/00 | (2006.01) |
| C08K 5/00 | (2006.01) |
| C08L 65/00 | (2006.01) |
| H01L 51/50 | (2006.01) |

(52) U.S. Cl.
CPC .......... *C08G 61/123* (2013.01); *H01L 51/0039* (2013.01); *H01L 51/0043* (2013.01); *C08G 2261/12* (2013.01); *C08G 2261/3142* (2013.01); *C08G 2261/3246* (2013.01); *C08G 2261/3247* (2013.01); *C08G 2261/411* (2013.01); *C08G 2261/95* (2013.01); *C08K 5/0091* (2013.01); *C08L 65/00* (2013.01); *H01L 51/5012* (2013.01); *H01L 51/5016* (2013.01); *Y10S 428/917* (2013.01)
USPC ............. 428/690; 428/917; 257/40; 313/504; 252/301.35; 528/8

(58) Field of Classification Search
None
See application file for complete search history.

(56) References Cited

U.S. PATENT DOCUMENTS

| | | | |
|---|---|---|---|
| 6,815,505 B2 | 11/2004 | Wu et al. | |
| 6,900,285 B2 | 5/2005 | Woo et al. | |
| 6,917,159 B2 | 7/2005 | Tyan et al. | |
| 7,763,320 B2 | 7/2010 | Yamazaki et al. | |
| 7,767,317 B2 | 8/2010 | Begley et al. | |
| 2002/0034656 A1 | 3/2002 | Thompson et al. | |
| 2003/0222246 A1* | 12/2003 | Ferraris et al. | 252/301.16 |
| 2006/0216545 A1* | 9/2006 | You et al. | 428/690 |
| 2006/0270827 A1 | 11/2006 | Chen | |
| 2006/0284140 A1* | 12/2006 | Breuning et al. | 252/301.35 |
| 2007/0093643 A1* | 4/2007 | You et al. | 528/396 |
| 2010/0001263 A1* | 1/2010 | Noguchi et al. | 257/40 |
| 2010/0173420 A1 | 7/2010 | Trogler et al. | |

FOREIGN PATENT DOCUMENTS

| | | | | |
|---|---|---|---|---|
| EP | 1298117 A2 | 4/2003 | | |
| EP | 2048177 A1 | 4/2009 | | |
| JP | 2004182783 A | 7/2004 | | |
| WO | 2007126929 A2 | 11/2007 | | |
| WO | WO 2008044003 A1 * | 4/2008 | ............. | H01L 51/00 |
| WO | WO2010000755 A1 | 1/2010 | | |

OTHER PUBLICATIONS

Guo et al. Adv. Mater. 2009, 21, 3682-3688. Year of publication: 2009.*
Yang et al. Macromolecules 2004, 37, 1211-1218. Date of web publication: Jan. 16, 2004.*
Fukuda et al. Jpn. J. Appl. Phys. 1989, 28. L1433-L1435. Year of publicaiton: 1989.*
Search Report and Written Opinion from corresponding PCT Application No. PCT/US2012/024800 dated Oct. 25, 2012.
Iketani et al., "Fluorene epoxy compounds for heat- and chemical-resistant cured products with good optical properties and low moisture absorption and their manufacture", Jul. 2, 2004.
Surasak et al., "Synthesis and Property of Poly(arylenesulfone)s Containing 9,9-Diarylfluorene Moiety in the Main Chain", Polymer Journal, pp. 731-736, May 29, 2007.

(Continued)

*Primary Examiner* — Andrew K Bohaty
(74) *Attorney, Agent, or Firm* — Mary Louise Stanford

(57) ABSTRACT

Energy efficient optoelectronic devices include an electroluminescent layer containing a polymer made up of structural units of formula I and II;

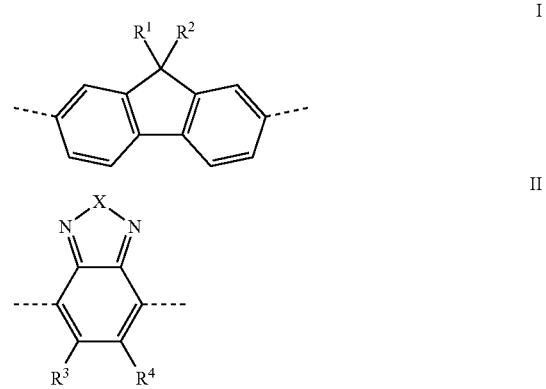

wherein
$R^1$ and $R^2$ are independently $C_{22-44}$ hydrocarbyl, $C_{22-44}$ hydrocarbyl containing one or more S, N, O, P, or Si atoms, oxaalkylaryl, or a combination thereof;
$R^3$ and $R^4$ are independently H, $C_{1-44}$ hydrocarbyl or $C_{1-44}$ hydrocarbyl containing one or more S, N, O, P, or Si atoms, or $R^3$ and $R^4$, taken together, form a $C_{2-10}$ monocyclic or bicyclic ring containing up to three S, N, O, P, or Si heteroatoms; and
X is S, Se, or a combination thereof.

10 Claims, 7 Drawing Sheets

(56) References Cited

OTHER PUBLICATIONS

Search Report PCT Application No. PCT/US2012/024800 dated Jun. 26, 2012.

Wei et al., "A New Type of Light-Emitting Naphtho[2,3-c][1,2,5]thiadiazole Derivatives: Synthesis, Photophysical Characterization and Transporting Properties", Journal of Materials Chemistry, vol. 18, pp. 806-818, 2008.

Yang et al., "Deep-Red Electroluminescent Polymers: Synthesis and Characterization of New Low-Band-Gap Conjugated copolymers for Light-Emitting Diodes and Photovoltaic Devices", vol. 38, pp. 244-253, 2005.

Yang et al., "High-Efficiency Saturated Red Emitting Polymers Derived From Fluorene and Naphthoselenadiazole", vol. 37, pp. 1211-1218, 2004.

Reinhardt et al., "Highly Active Two-Photon Dyes: Design, Synthesis, and Characterization Toward Application", vol. 10, pp. 1863-1874, 1998.

Jo et al., "Synthesis and Characterization of Monodisperse Oligofluorenes", Chem. Eur. J., vol. 10, pp. 2681-2688, 2004.

Yao et al., "Orientation Behavior of Bulk Heterojunction Solar Cells Based on Liquid-Crystalline Polyfluorene and Fullerene", J. Phys. Chem. C, vol. 114, pp. 18001-18011, 2010.

Zhang et al., "Field-Effect Transistors Based on a Benzothiadiazole-Cyclopentadithiophene Copolymer", J. Am. Chem. Soc., vol. 129, pp. 3472-3473, 2007.

Kim et al., "Liquid-Crystalline Semiconducting Copolymers With Intramolecular Donar-Acceptor Building Blocks for High-Stability Polymer Transistors", J. Am. Chem. Soc., vol. 131, pp. 6124-6132, 2009.

\* cited by examiner

MATERIALS FOR OPTOELECTRONIC DEVICES

STATEMENT REGARDING FEDERALLY SPONSORED RESEARCH AND DEVELOPMENT

This invention was made with Government support under contract number DE-FC26-07NT43226 awarded by the U.S. Department of Energy. The Government has certain rights in the invention.

BACKGROUND

The two most commonly used interior lighting technologies, incandescent and fluorescent lighting, consume more than 5 quads of energy in the United States. While these technologies are now mature and expected to achieve only incremental performance improvements, their properties have set the consumer's expectations for interior lighting products (i.e., light sources should be either inexpensive, have a pleasing color, and be readily dimmable (incandescent), or be very energy efficient and have a long lifetime (fluorescent)). Thus, new lighting systems must not only fulfill existing consumer expectations for lifetime, cost, ease of use, brightness, and color quality, but also offer significant enhancement in performance above that of existing technology. Mercury fluorescent lamp technology, in particular, is quite energy efficient, with nearly 30% conversion of electrical energy into visible light. As impressive as modern mercury-based technology is, it is fundamentally limited in efficiency by the need to create a high energy UV photon, and to a lesser extent by its shape, which usually mandates the use of lossy luminaire structures to redistribute the light. Thus, there is an opportunity for technologies that have comparable efficiency and can be used with minimal additional luminaries. Organic light emitting devices (OLED) are a technology that can potentially replace mercury fluorescent lighting. An OLED consists of a set of thin organic layers positioned between two electrodes, at least one of which is transparent or semi transparent. In a manner similar to LEDs, charge carriers are injected from the electrodes into the organic layers where they recombine and emit light that escapes the device through a transparent electrode. Since the active layers of the device are very thin (~100 nm), OLED devices are not usually free-standing, but are fabricated on a glass or polymer substrate that is typically at least 0.15 mm thick. Since OLED devices are very thin, they can be shaped directly into a desirable shape, avoiding luminaire losses. Even more importantly, white light emitting OLEDs do not generate UV photons and can be operated at voltages as low as 3V. As a consequence, the potential energy efficiency of OLED light systems (lamp+ luminaire) is a much as two times greater than that of a mercury fluorescent lamp. Currently, OLEDs with the highest reported efficiency are green devices with power conversion efficiencies of ~17%. A key factor that limits OLED energy efficiency is the external quantum efficiency, which is the ratio of emitted photons to injected charge carriers. Since the energy efficiency of a device is the product of the EQE and all the other energy loss terms in the device, the EQE value determines the upper limit of the device energy efficiency. Given typical white light OLED operating voltages and color characteristics, an EQE of ~50% is required to match the mercury fluorescent technology's 30% power conversion efficiency and 100 LPW performance. It is generally recognized that two fundamental conditions must be met for an OLED to achieve high EQE. First, all charges must recombine inside the device to form an emissive state that will generate light. The efficiency of this process is the internal quantum efficiency (IQE). Second, light generated by the emissive state must be extracted from the OLED active layers to air. Considerable development effort has been devoted to both light generation and light extraction. OLED devices exist with IQE values approaching unity and a number of light extraction schemes are reported. Presently, however, the most efficient OLEDs have EQEs of only ~30% and these devices have not yet been converted into stable white light sources.

BRIEF DESCRIPTION

Conjugated fluorine polymers capable of aligned singlet emission without loss due to triplet recombination have now been discovered. Accordingly, in one aspect, the present invention relates to polymers composed of structural units of formula I and II optoelectronic devices having an electroluminescent layer containing such polymers;

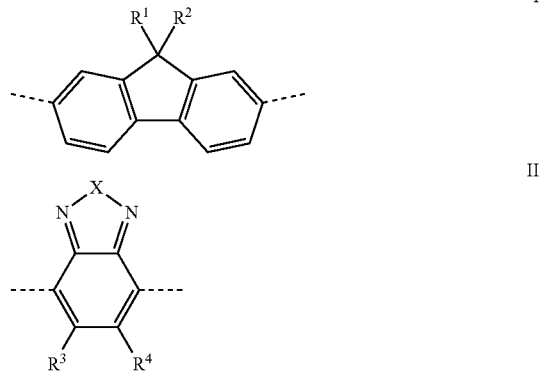

wherein $R^1$ and $R^2$ are independently $C_{22-44}$ hydrocarbyl, $C_{22-44}$ hydrocarbyl containing one or more S, N, O, P, or Si atoms, oxaalkylaryl, or a combination thereof;

$R^3$ and $R^4$ are independently H, $C_{1-44}$ hydrocarbyl or $C_{1-44}$ hydrocarbyl containing one or more S, N, O, P, or Si atoms, or $R^3$ and $R^4$, taken together, form a $C_{2-10}$ monocyclic or bicyclic ring containing up to three S, N, O, P, or Si heteroatoms; and X is S, Se, or a combination thereof.

DRAWINGS

DETAILED DESCRIPTION

The major source of loss in extraction efficiency in phosphorescent devices is coupling of energy into the plasmon modes of the metal cathode. Conjugated polymer-based OLEDs typically have fluorescent (singlet) emitting species that are aligned with the plane of the electrodes, and thus tend to have high extraction efficiencies and low calculated losses due to coupling to plasmon modes. These devices, however, have a lower IQE because charge carriers that recombine with the triplet do not emit, which cancels out their alignment advantage.

One approach to extracting light from the active device layers uses the demonstrated alignment advantage of fluorescent (singlet emitting) polymer films. To improve fluorescent devices, it is necessary to improve the IQE by forcing all charge carriers to recombine in the singlet state. A method to increase the IQE of singlet emission in OLEDs is called "extra-fluorescence". Extra-fluorescence works by inserting a mixing layer that incorporates heavy metals, such as iridium. The additional layer is positioned in such a way that it affects only charge transfer (CT) states, which are the precursors to excitons. By allowing these exciton precursors to mix, the formation of non-emissive triplets can be suppressed if certain energy levels constraints are met. Due to extrafluorescence, OLEDs that are based upon aligned fluorescent materials may have the same high IQE values as those based upon phosphorescent materials.

Figure 1:
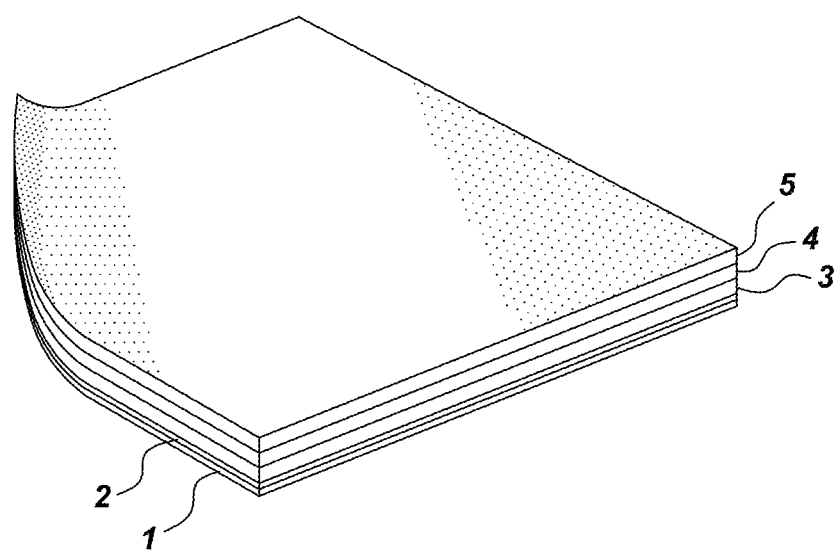
FIG. 1 is a schematic cross-sectional view of an optoelectronic device according to the present invention.

An organic optoelectronic device typically contains multiple layers which include, in the simplest case shown in FIG. 1, an anode layer 4 and a corresponding cathode layer 2 with an organic electroluminescent layer 3 disposed between said anode and said cathode. The device is enclosed between encapsulation layer 1 and transparent substrate 5. Such devices are exemplified by organic light emitting devices and organic photovoltaic (OPV) devices. When a voltage bias is applied across the electrodes of an OLED, electrons are injected by the cathode into the electroluminescent layer while electrons are removed from (or "holes" are "injected" into) the electroluminescent layer from the anode. Light emission occurs as holes combine with electrons within the electroluminescent layer. Similarly, when an OPV device absorbs photon energy, holes and electrons combine in the photoconductive layer and generates an electrical potential between the anode and cathode.

Singlet or triplet excitons are formed in the electroluminescent layer of an OLED device when holes combine with electrons, and singlet excitons transfer energy to the environment by radiative decay. Triplet excitons, unlike singlet excitons, typically cannot undergo radiative decay and hence do not emit light except at very low temperatures. Thus the formation of triplet excitons, represents a fundamental limitation on efficiency in organic light emitting devices which are typically operated at or near ambient temperature. Polymers according to the present invention may avoid formation of unproductive triplet excitons by preventing direct charge recombination on the polymer. In this case, emission from the polymer would only result from non-radiative energy transfer processes from an excited triplet state. For example, molecules with a blue emissive triplet state could transfer energy non-radiatively to the polymers according to the present invention, which would then produce lower energy radiation.

In particular embodiments, the polymers include structural units derived from fluorene monomers having organic substitutents in the 9,9-position that are larger than the fluorene group, especially long chain alkyl or oxaalkyl groups. It is believed that the substituents may isolate the emitting regions of the polymers and facilitate their alignment. Specifically, in structural units having long chain alkyl groups, $R^1$ and $R^2$ in formula II are $C_{22-44}$ hydrocarbyl. More specifically, in some embodiments, the structural unit of formula I is

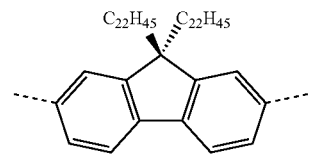

In structural units having long chain oxaalkyl groups, $R^1$ and $R^2$ in formula II are both —Ar $(OCH_2CH_2(CH_2)_m)_nOR^5$ wherein m is 0 or 1; n ranges between about 20 and about 500, and $R^5$ is lower alkyl. More specifically, the structural unit of formula I may be

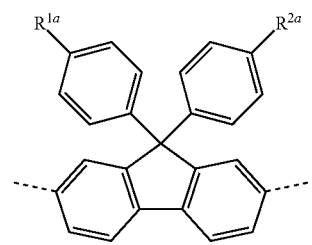

wherein $R^{1a}$ and $R^{2a}$ are independently —$(OCH_2CH_2(CH_2)_m)_nOR^5$, m is 0 or 1; n ranges between about 20 and about 500, and $R^5$ is lower alkyl. Even more specifically, the structural unit of formula I may be

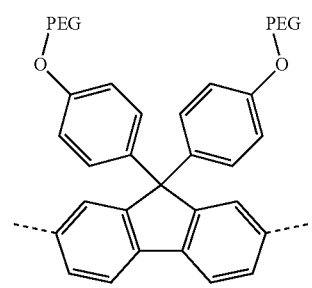

wherein PEG is —$CH_2CH_2(OCH_2CH_2)_n$; and n ranges between about 20 and about 500. Molecular weight of the PEG group is not critical and may be about 2000 Daltons or about 10,500 Daltons in particular embodiments. The present invention also relates to monomers used to prepare polymers having units derived from fluorene compounds that include oxaalkyl groups at the 9,9-position. These monomers are of formula

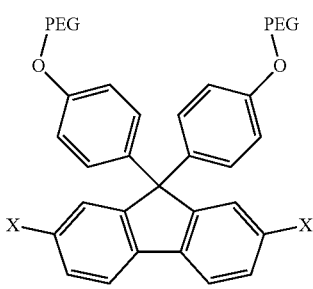

wherein $R^{1a}$ and $R^{2a}$ are independently $(OCH_2CH_2(CH_2)_m)_nOR^5$; m is 0 or 1; n ranges between about 20 and about 500; X is independently at each occurrence halo, triflate, $-B(OH)_2$, $-B(OR)_2$, $-BO_2R$, or a combination thereof; and R is alkyl or alkylene.

Examples of the structural unit of formula II include

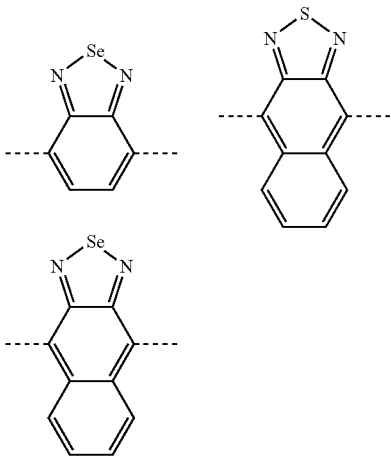

Molecular weight of polymers according to the present invention ranges from about 1000 Daltons to about 200000 Daltons (Mn) and from about 10000 Daltons to about 100000 Daltons (Mw). More particularly, Mw ranges from about 2000 to about 100000 Daltons.

The polymers may also include structural units of formula in addition to those of formula I or II. Particularly suitable comonomers include the triarylamines described in U.S. Pat. No. 6,309,763 and U.S. Pat. No. 6,605,373, assigned to Dow.

The electroluminescent layer may also include homopolymers of the triarylamines, polyvinylcarbazoles or light-emitting iridium-containing organometallic complexes. These additional materials may be blended with the polymers of the present invention or may be present in a contiguous layer in physical contact with the polymers. Suitable iridium complexes include, for example, iridium compounds composed of an organic cyclometallated ligand and a ketopyrrole ligand, such as those described in WO 2008/014037, from General Electric Company. Other exemplary complexes that may be used are described in U.S. Pat. No. 6,048,630; U.S. Pat. No. 6,097,147; U.S. Pat. No. 6,303,238; U.S. Pat. No. 6,830,828; and U.S. Pat. No. 6,894,307.

Other components, which may be present in an organic light-emitting device in addition to the anode, cathode and light emitting material, include hole injection layers, electron injection layers, and electron transport layers. During operation of an organic light-emitting device comprising an electron transport layer, the majority of charge carriers (i.e. holes and electrons) present in the electron transport layer are electrons and light emission can occur through recombination of holes and electrons present in the electron transport layer. Additional components, which may be present in an organic light-emitting device, include hole transport layers, hole transporting emission (emitting) layers, hole blocking layers and electron transporting emission (emitting) layers.

The organic electroluminescent layer is a layer within an organic light emitting device which when in operation contains a significant concentration of both electrons and holes and provides sites for exciton formation and light emission. A hole injection layer is a layer usually in contact with the anode, which promotes the injection of holes from the anode into the interior layers of the OLED; and an electron injection layer is a layer usually in contact with the cathode that promotes the injection of electrons from the cathode into the OLED. Neither the hole injection layer nor the electron transport layer need not be in contact with the cathode. Frequently the electron transport layer is not an efficient hole transporter and thus it serves to block holes migrating toward the cathode. An electron transport layer is a layer, which facilitates conduction of electrons from cathode to a charge recombination site. A hole transport layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. A electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk conductivity of at least about 100 ohms per square inch, as measured by a four-point probe technique. Indium tin oxide (ITO) is frequently used as the anode because it is substantially transparent to light transmission and thus facilitates the escape of light emitted from electro-active organic layer. Other materials, which may be utilized as the anode layer, include tin oxide, indium oxide, zinc oxide, indium zinc oxide, zinc indium tin oxide, antimony oxide, and mixtures thereof.

Materials suitable for use as the cathode include zero valent metals, which can inject negative charge carriers (electrons) into the inner layer(s) of the OLED. Various zero valent metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

Materials suitable for use in hole injection layers include 3,4-ethylenedioxythiophene (PEDOT) and blends of PEDOT with polystyrene sulfonate (PSS), commercially available from H. C. Stark, Inc. under the BAYTRON® tradename, and polymers based on a thieno[3,4b]thiophene (TT) monomer, commercially available from Air Products Corporation.

Materials suitable for use in hole transporting layers include 1,1-bis((di-4-tolylamino)phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino)benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis(4-methylphenyl)-(1,1'-biphenyl)-4,4'-diamine, copper phthalocyanine, polyvinylcarbazole, (phenylmethyl)polysilane; poly(3,4-ethylene dioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use as the electron transport layer include poly(9,9-dioctyl fluorene), tris(8-hydroxyquinolato) aluminum (Alq3), 2,9-dimethyl-4,7-diphenyl-1,1-phenanthroline, 4,7-diphenyl-1,10-phenanthroline, 2-(4-biphenylyl)-5-(4-t-butyl phenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

OPV devices are described in, for example, US 20040118444, entitled Large-Area Photovoltaic Devices and Methods of Making Same, assigned to the General Electric Company, the entire contents of which are incorporated by reference herein. An OPV device may include two semi-transparent charge conducting electrodes, one acting as a positive charge collector, the other as a negative charge collector and an organic film between the two electrodes. The electrodes may be comprised of a doped thin metal oxide film, such as $SnO_2$, $ZnO_2$, indium tin oxide, or it may be comprised of thin metal film using such elements as silver, gold, or aluminum. The conductive electrodes may be prepared using physical vapor deposition or via sputter coating techniques. Between the electrodes there may be one or more organic materials that produce charged carriers following the absorption of light. Typically charge separation is achieved by juxtaposing two materials such that the most stable state of the electron (negative charge carrier, electron acceptor) is on one material, and the hole (positive charge carrier, electron donor) is on the other. One example of such a material pair is 3,4,9,10-perylene tetracarboxylic bisbenzimidazole (PTCBI, an electron acceptor), and copper phthalocyanine (CuPc, an electron donor). Another possible material pair includes poly (2-methoxy-5-(3',7' dimethyloctyloxy) 1,4, phenylene-vinylene, (MDMO-PPV) and (6,6) phenyl-C61-butyric acid methyl ester (PCBM). In addition, hybrid structures consisting of both organic components (such as poly-phenylene-vinylene derivatives) and inorganic nanocrystals of materials such as CdSe, or ZnTe may also be used. Such nano-crystalline materials may vary in size and shape, from ~2 nm spheres to high aspect ratio rods of order microns in size, or may even possess multiple high aspect rods connected to a single core. The electron donor and acceptor materials may be deposited in either discrete layered structures or blended together.

The OPV devices may be composed of many layers, each of which can vary from a few nm to microns in thickness. Typical thicknesses of the organic layers are on the order of 10 nm-100 nm. Such multilayered devices may be prepared either by solution processing or via physical vapor deposition techniques. Multilayer solution processed devices may be formed by the successive application of materials using solvents that do not dissolve underlying layers. A suitable first layer for a solution processed device is poly(3,4-ethylene-dioxythiophene):poly(styrenesulfonate) which does not dissolve in many organic solvents, followed by a blend of (MDMO-PPV and PCBM) deposited from an organic solvent such as chlorobenzene. Multilayer organic structures may also be formed by physical vapor deposition of successive thin organic films, which may consist of one or more component molecules. As in the case of the amorphous silicon based photodiode, the overall thickness of the organic layers may be adjusted to obtain a desirable fraction of charge integrating signal relative to photon-counting signal To more clearly and concisely describe and point out the subject matter of the claimed invention, the following definitions are provided for specific terms.

"Aryl" and "heteroaryl" mean a 5- or 6-membered aromatic or heteroaromatic ring containing 0-3 heteroatoms selected from nitrogen, oxygen or sulfur; a bicyclic 9- or 10-membered aromatic or heteroaromatic ring system containing 0-3 heteroatoms selected from nitrogen, oxygen or sulfur; or a tricyclic 13- or 14-membered aromatic or heteroaromatic ring system containing 0-3 heteroatoms selected from nitrogen, oxygen or sulfur. The aromatic 6- to 14-membered carbocyclic rings include, for example, benzene, naphthalene, indane, tetralin, and fluorene; and the 5- to 10-membered aromatic heterocyclic rings include, e.g., imidazole, pyridine, indole, thiophene, benzopyranone, thiazole, furan, benzimidazole, quinoline, isoquinoline, quinoxaline, pyrimidine, pyrazine, tetrazole and pyrazole. Arylene refers to a radical that is bivalent and formed by removal of hydrogen from two carbon sites on an aromatic nucleus. Arylidene refers to an alkylidene unit substituted with an aryl group.

"Arylalkyl" means an alkyl residue attached to an aryl ring. Examples are benzyl and phenethyl. Heteroarylalkyl means an alkyl residue attached to a heteroaryl ring. Examples include pyridinylmethyl and pyrimidinylethyl. Alkylaryl means an aryl residue having one or more alkyl groups attached thereto. Examples are tolyl and mesityl.

"Alkoxy" or "alkoxyl" refers to groups of from 1 to 8 carbon atoms of a straight, branched, cyclic configuration and combinations thereof attached to the parent structure through an oxygen. Examples include methoxy, ethoxy, propoxy, isopropoxy, cyclopropyloxy, and cyclohexyloxy. Lower alkoxy refers to groups containing one to four carbons.

"Acyl" refers to groups of from 1 to 8 carbon atoms of a straight, branched, cyclic configuration, saturated, unsaturated and aromatic and combinations thereof, attached to the parent structure through a carbonyl functionality. One or more carbons in the acyl residue may be replaced by nitrogen, oxygen or sulfur as long as the point of attachment to the parent remains at the carbonyl. Examples include acetyl, benzoyl, propionyl, isobutyryl, t-butoxycarbonyl, and benzyloxycarbonyl. Lower-acyl refers to groups containing one to four carbons.

"Heterocyclic" means a cycloalkyl or aryl residue in which one to two of the carbons are replaced by a heteroatom such as oxygen, nitrogen or sulfur. Examples of heterocycles that fall within the scope of the invention include pyrrolidine, pyrazole, pyrrole, indole, quinoline, isoquinoline, tetrahydroisoquinoline, benzofuran, benzodioxan, benzodioxole (commonly referred to as methylenedioxyphenyl, when occurring as a substituent), tetrazole, morpholine, thiazole, pyridine, pyridazine, pyrimidine, thiophene, furan, oxazole, oxazoline, isoxazole, dioxane, and tetrahydrofuran.

"Substituted" refers to residues, including, but not limited to, alkyl, alkylaryl, aryl, arylalkyl, and heteroaryl, wherein up to three H atoms of the residue are replaced with lower alkyl, substituted alkyl, aryl, substituted aryl, haloalkyl, alkoxy, carbonyl, carboxy, carboxalkoxy, carboxamido, acyloxy, amidino, nitro, halo, hydroxy, $OCH(COOH)_2$, cyano, primary amino, secondary amino, acylamino, alkylthio, sulfoxide, sulfone, phenyl, benzyl, phenoxy, benzyloxy, heteroaryl, or heteroaryloxy.

"Haloalkyl" refers to an alkyl residue, wherein halogen atoms replace one or more hydrogen atoms; the term haloalkyl includes perhaloalkyl. Examples of haloalkyl groups that fall within the scope of the invention include $CH_2F$, $CHF_2$, and $CF_3$.

"Oxaalkyl" refers to an alkyl residue in which one or more carbons have been replaced by oxygen. It is attached to the parent structure through an alkyl residue. Examples include methoxypropoxy, 3,6,9-trioxadecyl and the like. The term oxaalkyl refers to compounds in which the oxygen is bonded via a single bond to its adjacent atoms (forming ether bonds); it does not refer to doubly bonded oxygen, as would be found in carbonyl groups. Similarly, thiaalkyl and azaalkyl refer to alkyl residues in which one or more carbons has been replaced by sulfur or nitrogen, respectively. Examples include ethylaminoethyl and methylthiopropyl.

EXAMPLES

Materials and Characterization. All manipulations of air sensitive materials were performed under an atmosphere of dry nitrogen. All solvents were purchased from Fisher Scientific and used without further purification unless otherwise noted. All reagents, unless otherwise specified, were purchased from Sigma-Aldrich and used without further purification. $^1$H NMR spectra were acquired on a Bruker Avance 400 MHz NMR. GPC were obtained on an Agilent 1100 GPC with a Polymer Laboratories Mixed Bed-C column with chloroform as the mobile phase and referenced to polystyrene standards. HPLC were obtained on an Agilent 1100 HPLC using a Zorbax Eclipse XDB-C8 column and water/acetonitrile mobile phase. The absorption spectra were recorded using a Varian Cary 300 Scan UV-Visible spectrophotometer.

TABLE 1

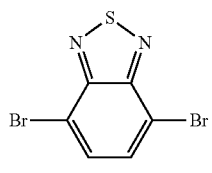

BTD

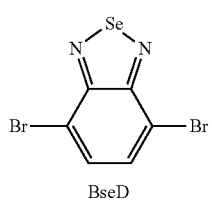

BseD

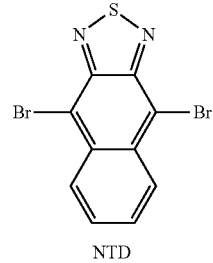

NTD

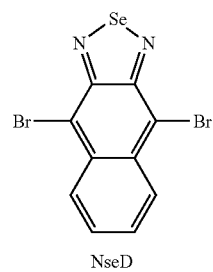

NseD

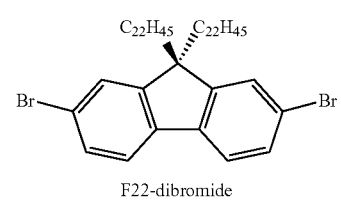

F22-dibromide

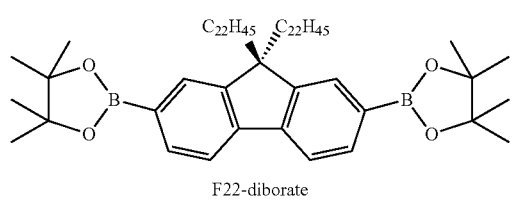

F22-diborate

Materials 4,7-Dibromo-2,1,3-benzothiadiazole (BTD)(1) The procedure described by Yang, et al., was used for the preparation of (1)(Yang, R.; Tian, R; Yan, J.; Zhang, Y.; Yang, J.; Hou, Q.; Yang, W.; Zhang, C and Cao, Y. Macromolecules 2005, 38, 244)

4,9-Dibromonaphtho[2,3-c][1,2,5]thiadiazole (NTD) (2): The procedure described by Wei, et al., was used for the preparation of (2)(Wei, P.; Duan, L.; Zhang, D.; Qiao, J.; Wang, L.; Wang, R.; Dong, G. and Qui, Y. J. Mater. Chem. 2008, 18, 806).

4,7-Dibromo-2,1,3-benzoselenadiazole (BSeD) (3): The procedure described by Yang, et al., was used for the preparation of (3)(Yang, J,; Jiang, C.; Zhang, Y.;Yang, R.;Yang, W.; Hou, Q.; and Cao, Y. Macromolecules 2004, 37, 1211)

4,9-dibromonaphtho[2,3-c][1,2,5]selenadiazole (NSeD) (4) The procedure described by Reinhart, et al., was used for the preparation of (4)(Reinhardt, B.; Brott, L.; Clarson, S.; Dillard, A.; Bhatt, J.; Kannan, R.; Yuan, L.; He, G.; and Prasad, P. Chem. Mater. 1998, 10, 1863.)

2,3-Diaminonaphthalene was purchased from 3B Scientific Corporation and used without further purification.

Example 1

2,7-Dibromo-9,9-didocosyl-9H-fluorene (F22-dibromide) (5)

The procedure described by Jo, et al., was adapted for the preparation of (5) (Jo, J.; Chi, C.; Hoger, S.; Wegner, G. and Yoon, D. Chem. Eur. J. 2004, 10, 2681). A mixture of 2,7-dibromo-9H-fluorene (16.2 g, 50 mmol), potassium iodide (80 mg, 5 mmol), potassium hydroxide (86.2% KOH from J. T. Baker, 16.3 g, 250 mmol) and dimethyl sulfoxide (100 mL) were stirred magnetically in a 250 mL 3-necked round-bottomed flask. The flask was purged with nitrogen for 15 minutes and 1-bromodocosane (50.6 g, 130 mmol) was added. The flask was heated to 60° C. and stirred overnight. The hot solution was poured over ice and the product extracted with 1 liter of hexanes. The hexane extract was washed with brine, dried over MgSO4 and the solvents evaporated to yield 40 grams of off-white powder which was composed of the product and residual 1-bromodocosane. Final de-colorization was achieved by warming 5 grams of the product in 50 mL hexane/sulfuric acid (25/25) with 250 mg of chromium oxide for 30 minutes. The hexane layer was collected washed three times with water and then filtered through acidic alumina. The alumina was washed with 40 mL hot hexanes. Rotary evaporation of the solvents yielded 4 grams of pure white product. If traces of 1-bromodocosane remained additional recrystallizations from either ethyl acetate or butyl acetate provided spectroscoptically pure product.

Example 2

2,7-Bis(4,4,5,5-tetramethyl-1,3,2-dioxaborolan-2-yl)-9,9-didicosylfluorene (F22-diborate) (6)

The diborate (6) was synthesized using a modified version of procedure used by Jo et. al. The dibromide (5) (6 g, 6.4 mmol) was combined with bis(pinacolato)diboron (9.8 g, 38.6 mmol), potassium acetate (3.79 g, 98.15 mmol), 2-dicyclohexylphosphino-2',6'-dimethoxybiphenyl (SPhos) (262 mg, 0.638 mmol) in 100 mL of anhydrous THF in a 250 mL round-bottomed flask. The solution was purged with nitrogen for 30 minutes and Pd(II)Cl2 (45 mg, 0.26 mmol) was added and the reaction was brought to reflux for four hours. Once cooled, the THF was removed by rotary evaporation and the residue extracted with hexanes. The extract was filtered through Celite and then concentrated. Chromatography on silica gel with heptane yielded 5.54 grams (84% yield) of pure product.

General Polymerization Procedure

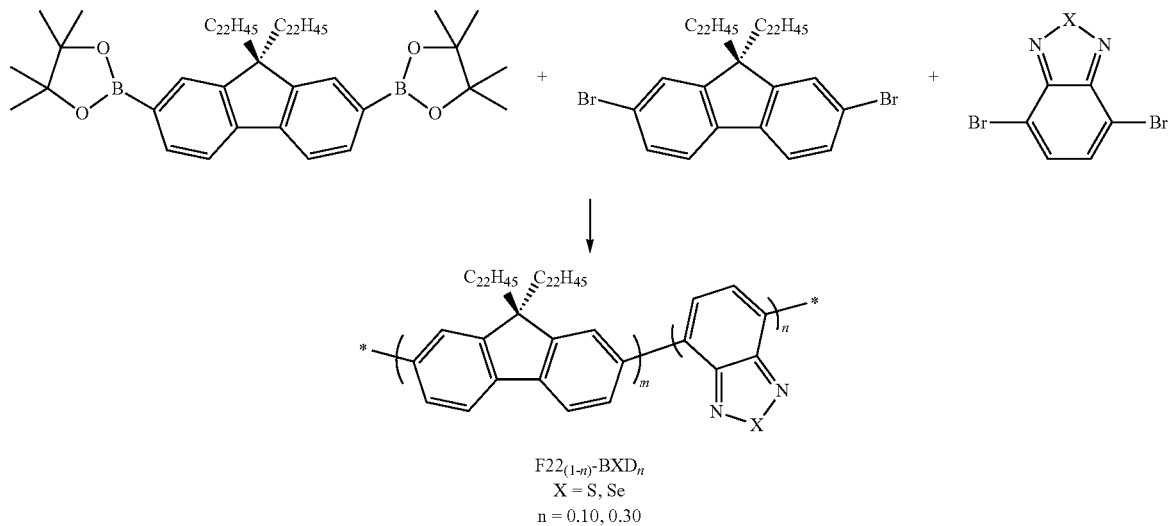

Scheme 1. General synthesis of BTD and BSeD containing polymers

F22$_{(1-n)}$-BXD$_n$
X = S, Se
n = 0.10, 0.30

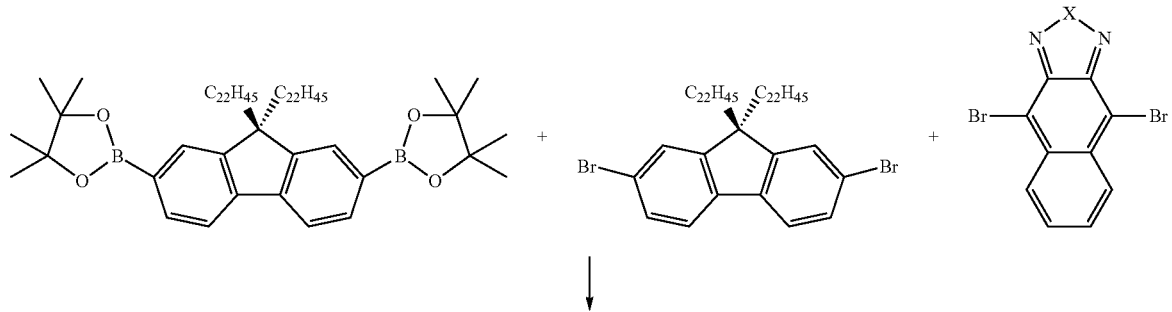

Scheme 2. General synthesis of NTD and NSeD containing polymers

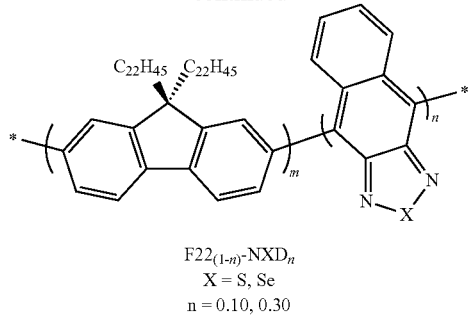

$F22_{(1-n)}\text{-}NXD_n$
$X = S, Se$
$n = 0.10, 0.30$

Polymers were synthesized using the method outlined in Scheme 1 or 2, as appropriate, and the following procedure:

All monomers are dried at 50° C. in a vacuum oven for at least 2 hrs prior to weighing. A 25 ml 2-neck flask with a nitrogen inlet to a bubbler and a magnetic stirrer is charged with all the monomers, SPhos and 5 ml of the toluene. This solution is degassed with nitrogen for 5-10 minutes then Pd(OAc)$_2$ is added using the remaining toluene to wash the weighing funnel. Simultaneously in a separate vial, the aqueous components are degassed with nitrogen.

After at least 15 minutes of degassing, the aqueous components are added to the organic solution and the flask is immersed in a 70° C. oil bath. Stirring and heating under a positive nitrogen pressure are continued for 16-20 hours at which point 4-ethyl-phenylboric acid, 20 mg is added. After one hour 100 L of n-butyl-4-iodobenzene is added. After an additional hour, the mixture is allowed to cool and is then diluted with about 10 ml each of toluene and water. The mixture is transferred to a separatory funnel, the aqueous phase is discarded and the organic phase is washed with 3×50 ml water and 1×50 ml of saturated NaCl. The organic solution is then passed through a funnel containing Celite and Drierite and the filtered solution is stirred for at least 30 minutes with mercapto-functional silica gel filtered and then stirred overnight with a few milligrams of sodium borohydride. The solution is again filtered and concentrated to a volume of about 5 ml on a rotary evaporator then loaded on to a toluene saturated silica gel cartridge. The polymer is eluted from the column with toluene (~100 ml) and the toluene solution is concentrated to ~5 ml. The polymer is isolated by precipitating the solution into 10 volumes of methanol with vigorous stirring. The polymer is collected by filtration, washed with methanol and dried in a 40-50° C. vacuum oven.

Examples 3-9

Polymer Synthesis

Reagents for the synthesis of F22$_{90}$-BTD$_{10}$ (P1) are shown in Table 2. Amounts of monomers for preparation of polymers P2-P6 in Table 3 were adjusted according to the desired polymer composition.

TABLE 2

| Compound | Amount | MW | μmol |
|---|---|---|---|
| F8-diborate | 264.0 mg | 1035 | 255 |
| F8-dibromide | 188.2 mg | 941.2 | 200 |

TABLE 2-continued

| Compound | Amount | MW | μmol |
|---|---|---|---|
| BTD | 14.7 mg | 294.0 | 50 |
| Pd(Oac)$_2$ | 2.2 mg | 224.5 | 10 |
| Sphos | 14.4 mg | 410.5 | 35 |
| Et$_4$NOH | 920 μL | 147.3 | 1250 |
| Water | 920 μL | | |
| Toluene | 10 mL | | |

All polymers were characterized by GPC and if a low molecular weight tail was found the polymer was fractionally precipitated into butyl acetate. Molecular weights and yields reported reflect the fractionated polymer. Polymers P6 and P7 yielded oligomer product unsuitable for this study. It should be noted that under our standard methodology, as the bandgap of the monomer decreased, the polymerizability of the system decreased, indicated by decreasing yields and molecular weights. As expected we see the longer molecular weight absorption due to the aromatic diazole moiety. Additionally, a hypsochromic shift in the absorption from the fluorene backbone with increased aromatic diazole was observed, due to the decreasing average fluorene block length.

TABLE 3

GPC, Yield and UV/Vis characterization of synthesized polymers.

| Ex. No. | Polymer Name | Mw, Mn, pd | Yield % | UV peaks (nm) |
|---|---|---|---|---|
| 3 | P1 | F22$_{90}$-BTD$_{10}$ | 117k, 60k, 2.0 | 50% 385, 447 sh |
| 4 | P2 | F22$_{70}$-BTD$_{30}$ | 111k, 50k, 2.2 | 74% 366, 450 |
| 5 | P3 | F22$_{90}$-BSeD$_{10}$ | 83.8k, 39.1k, 2.1 | 68% 382, 460 |
| 6 | P4 | F22$_{70}$-BSeD$_{30}$ | 54.8k, 28.8k, 2.2 | 62% 367, 471 |
| 7 | P5 | F22$_{90}$-NTD$_{10}$ | 48.6k, 24.5k, 2.0 | 25% 385, 509 |
| 8 | P6 | F22$_{70}$-NTD$_{30}$ | Mn <5k | <10% NA |
| 9 | P7 | F22$_{90}$-NSeD$_{10}$ | OP | <10% NA |

OP = oligomeric product,
sh = shoulder,
NA = not available

Example 10

Preparation of pegylated 4,4'-(2,7-dibromo-9H-fluorene-9,9-diyl)diphenol

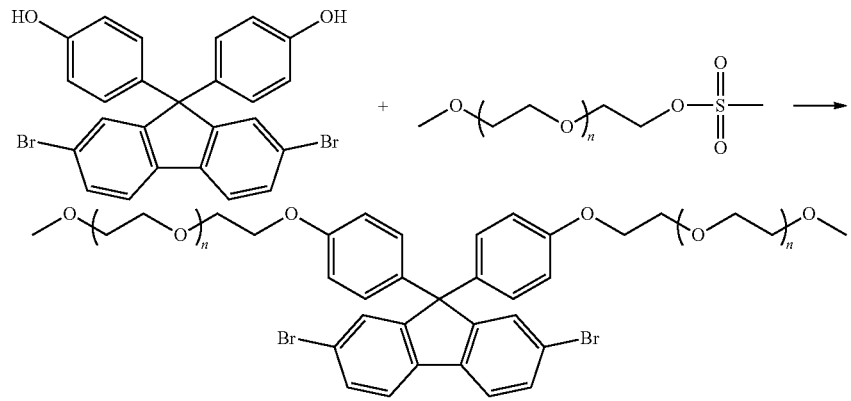

Pegylated 4,4'-(2,7-dibromo-9H-fluorene-9,9-diyl)diphenol (dibromoBPF) was prepared as follows. DibromoBPF (0.407 g, 0.8 mmol) and mesylated PEG-5000 monomethyl ether (10 g, 2.0 mmol) were brought to reflux in 50 mL of acetone with potassium carbonate (0.276 g, 2.0 mmol). The reaction was heated at reflux for 4 days at which point quantitative conversion was reached as determined by HPLC. Solvent was removed by rotary evaporation and the residue extracted with dichloromethane. The dichloromethane was washed twice with water and once with saturated aqueous sodium chloride. The dichloromethane solution was dried with magnesium sulfate and the solvents removed by rotary evaporation to yield the pegylated product containing approximately 30 wt % of residual mesylated PEG-5000. The monomer was used without further purification. Peaks at 3.61 and 3.36 ppm in the 1H NMR does not integrate properly as the molecular weight of PEG 5000 is not exact and residual mesylated PEG remained in the product. 1H NMR (400 MHz, CD2Cl2) 7.66 (d, 2H), 7.53-7.49 (m, 4H), 7.47 (d, 4H), 6.82 (d, 4H), 3.61 (s, ~1270H), 3.36 (s, 8H).

Photophysics of Polymers with Long Alkyl Side Chains
General Procedures

Spectra and time resolved dynamics following optical excitation of the polymers were acquired using an Edinburgh instruments F920 fluorimeter using pulsed laser excitation either at 469 nm (Picoquant, ~70 ps pulse width) or 355 nm (~500 ps pulsewidth JDS Uniphase). The detector was a spectrally corrected MCP-PMT R3809 (Hamamatsu). Chlorobenzene (Aldrich) was used as a solvent medium for solutions of the test materials. The concentration of the solutions was adjusted so that the optical density of the different solutions was less than 1.0 at the range of 450 nm-470 nm.

The general procedure for the preparation of neat films was to dissolve the material as a 1% solution of the polymer in an aromatic solvent such as toluene, xylene, or chlorobenzene and to then deposit on clean quartz slides via spin casting. Typical spin speeds were between 0.8 and 3 krpm. The films were allowed to dry before use, but were not, in general, thermally annealed. During the photoluminescence experiments, the films were placed in a purged nitrogen atmosphere to retard possible degradation during the experiment due to photo-oxidation.

Example 11

Solution Luminescence Spectra

Figure 2A:
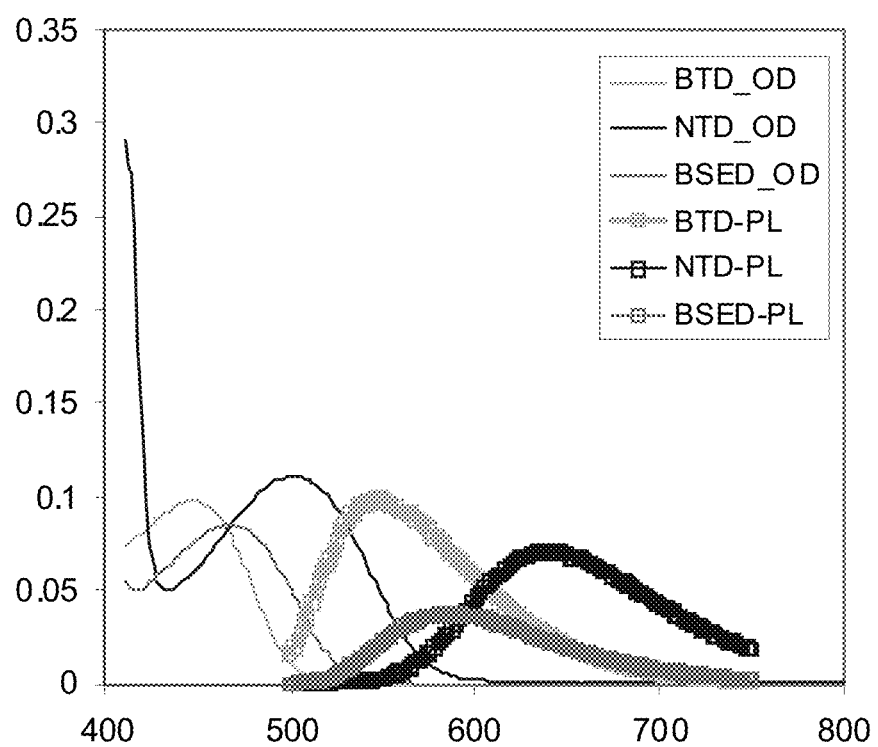
FIG. 2A is a graph showing optical absorption and emission spectra of polymers according to the present invention.

Solution absorption and emission spectra of the polymers of Example 4 (P2), Example 6 (P4), and Example 7 (P5) is shown in FIG. 2A. The alignment and intensity of the instrument was maintained throughout the experiment and thus the integrated intensities of the photoluminescence are directly comparable and can be used to provide a relative photoluminescence quantum yield. The BTD-30 sample had the highest luminescence efficiency and the luminescence quantum efficiencies were thus referenced to the BTD-30 sample. The spectra indicate that the emission shifts to longer wavelengths as selenium is substituted for sulfur and the conjugation is increased via the substitution of a napthyl group in place of the phenyl on the dithiazole co-monomer.

Figure 2B:
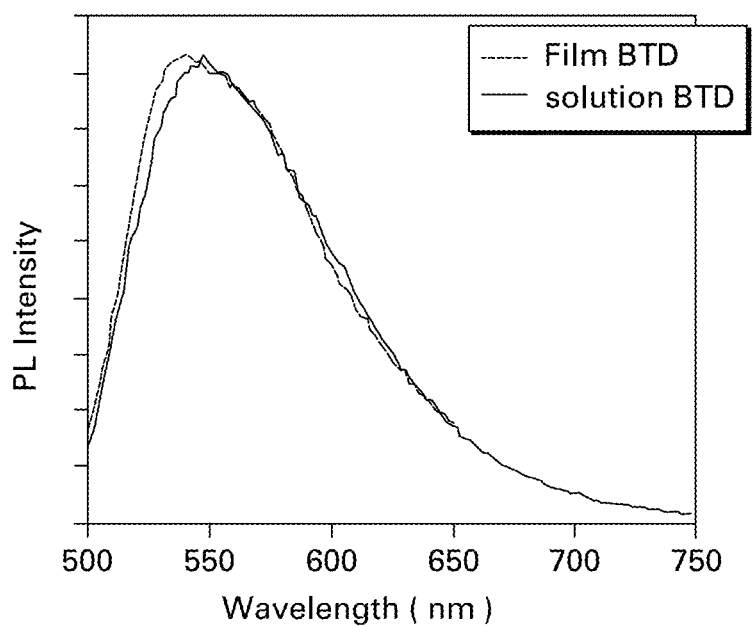
FIGS. 2B and 2C are graphs showing photoluminescence spectra comparing films and solutions of polymer according to the present invention.
Figure 2C:
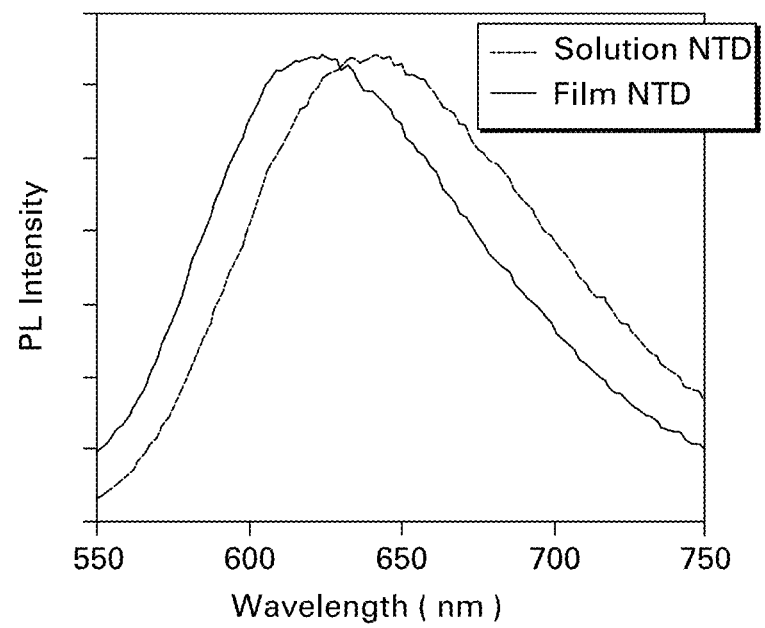

The luminescence spectra of the polymer films are shown in FIGS. 2B and 2C. The observed emission wavelengths in these spectra in the range of 500 nm-700 nm are consistent with the features observed in the same wavelength range in the solution phase spectra. We have also observed (not shown) a small shift in the luminescence emission maximum as the relative proportion of the co-monomer (i.e., BTD, NTD, BSeD, NSeD) is increased.

Example 12

Time Resolved Spectra of Pure Materials

Figure 3:
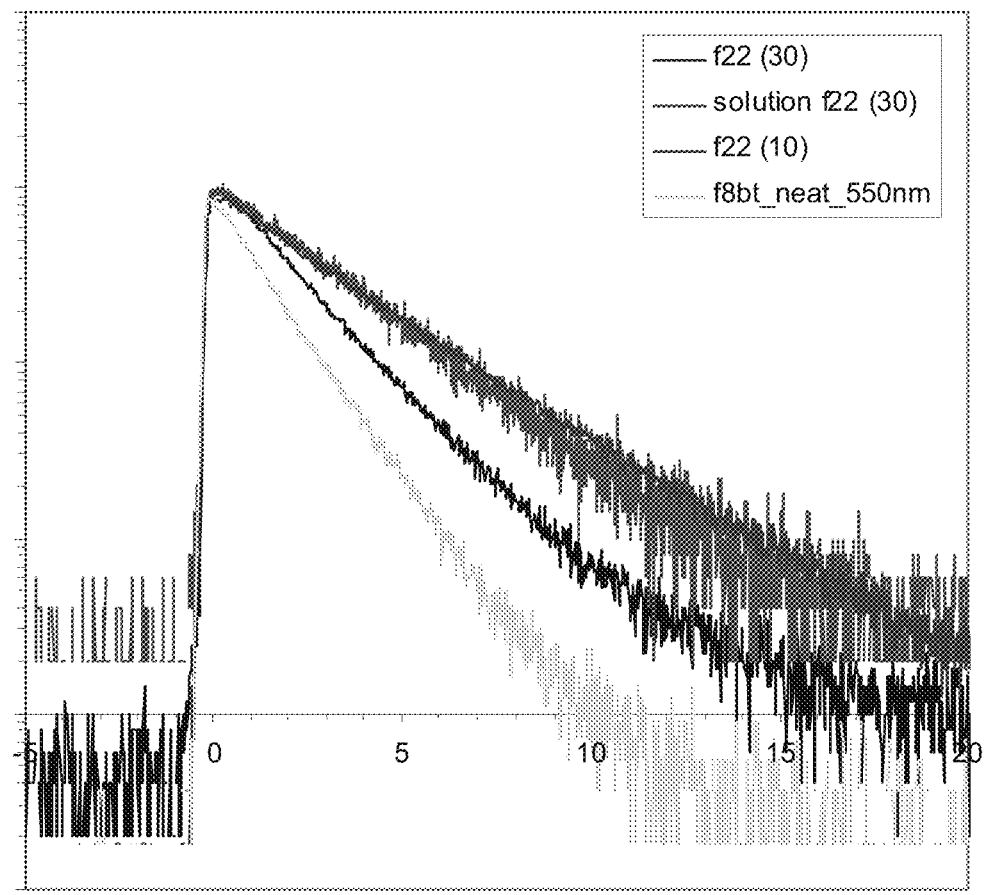
FIG. 3 is a graph depicting luminescence decay of polymers according to the present invention following photo-excitation.

The luminescence behavior of the polymers also depends upon the co-monomer and its relative loading to the fluorene monomer. FIG. 3 shows the luminescence decay curves of the BTD copolymers of Examples 3 and 4 following optical excitation. The figure also shows the corresponding luminescence decay curves following excitation at 468 nm of a F22-BTD-30 polymer (Example 4) in solution and a polymer composed of equal amounts of units derived from 9,9-dioctyl fluorine and BTD (F8-BTD), which was obtained from Sumation.

Figure 4A:
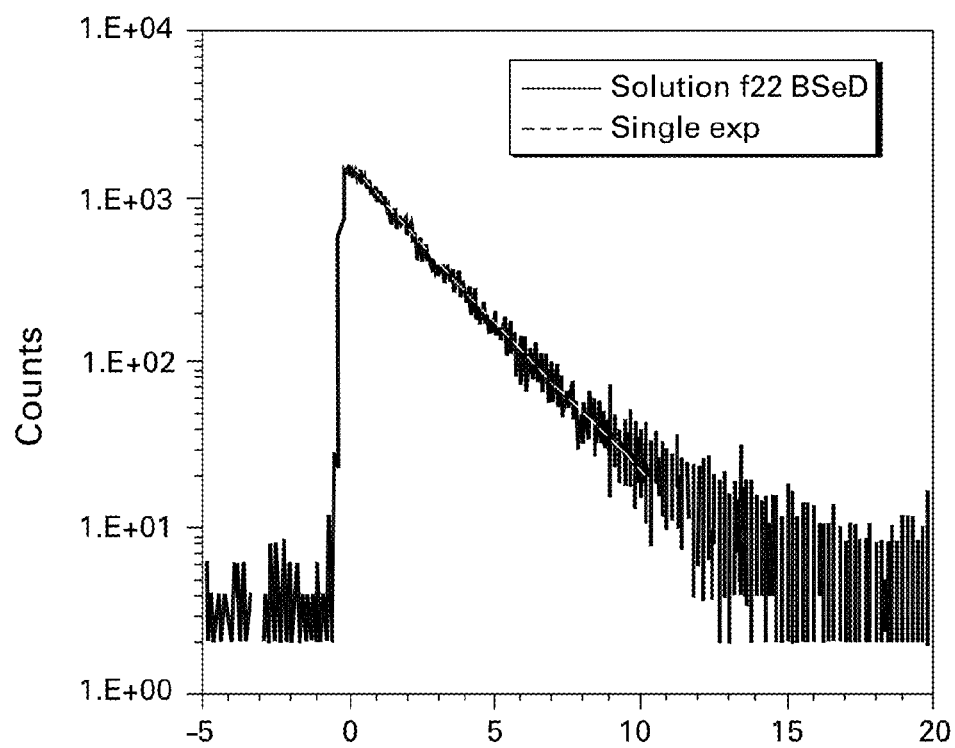
FIGS. 4A-4C are photoluminescence decay curves for solutions of polymers according to the present invention in chlorobenzene solution.
Figure 4B:
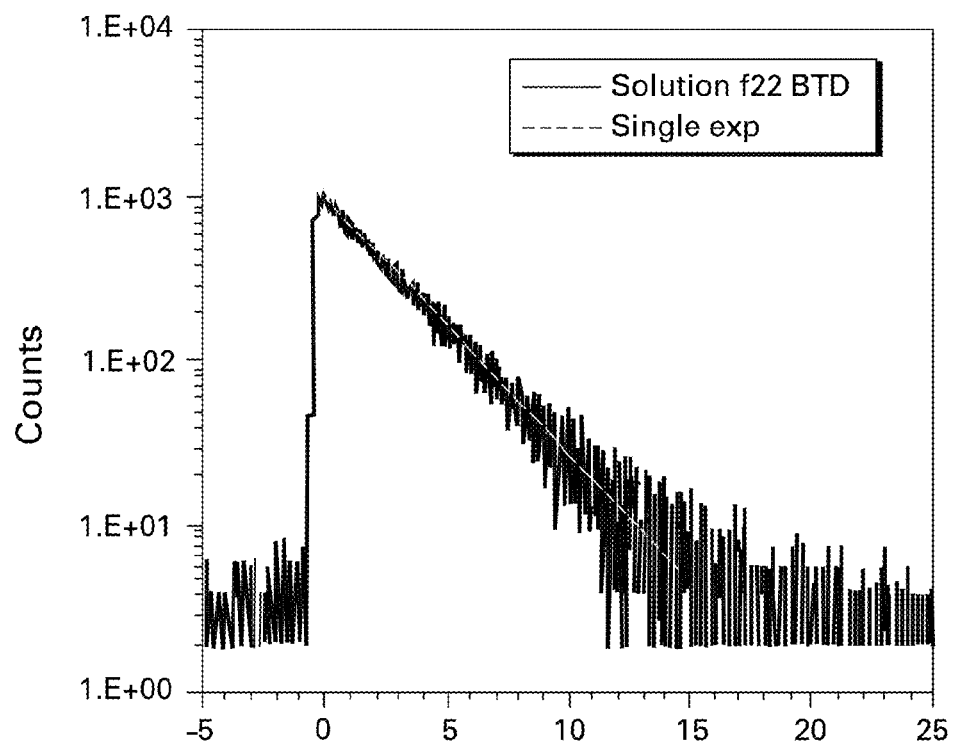
Figure 4C:
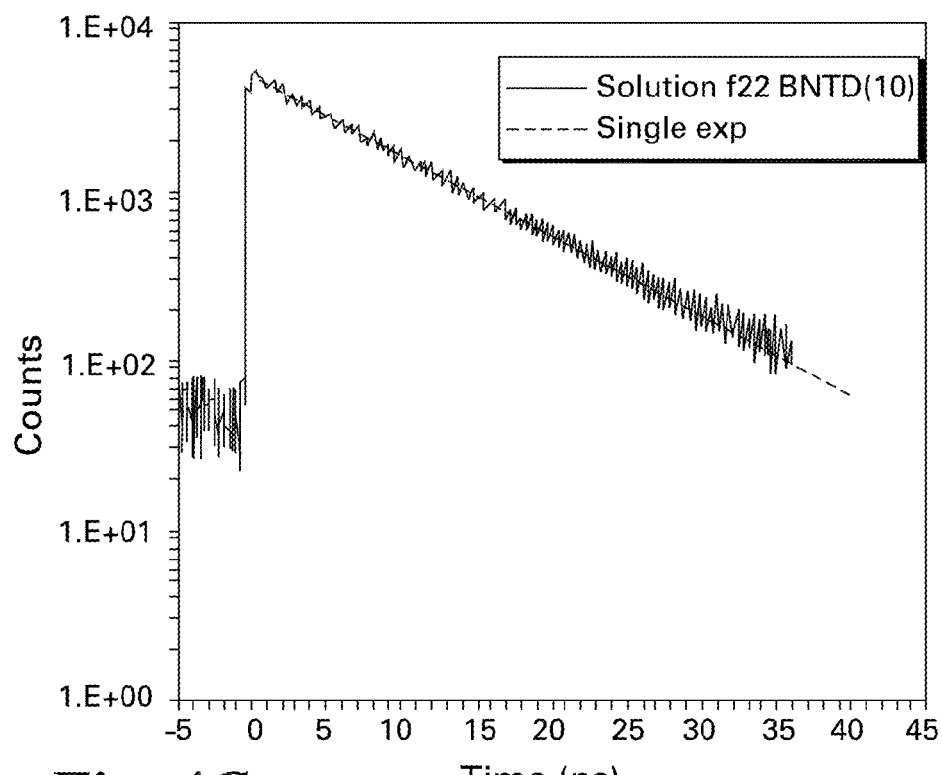

Time resolved luminescence decay spectra of the polymers of Example 6 (P4, F22-BSeD-30), Example 4 F22-BTD-30 and Example 7 (P5, F22-NTD-10) in chlorobenzene solution following 468 nm laser excitation are shown in FIG. 4A-4C. In each case, the detection wavelength was set to be near the peak of the emission spectrum, and the data was fit to a single exponential decay of the form:

$$A(t)=C\exp(-(t/\tau))$$

The observation of satisfactory fits to the data using this functional form usually indicate a the presence of a dominant first order relaxation process from a single excited state. The single exponential fits are extremely useful in that they assign dominant time constant to the luminescence decay process.

Figure 5A:
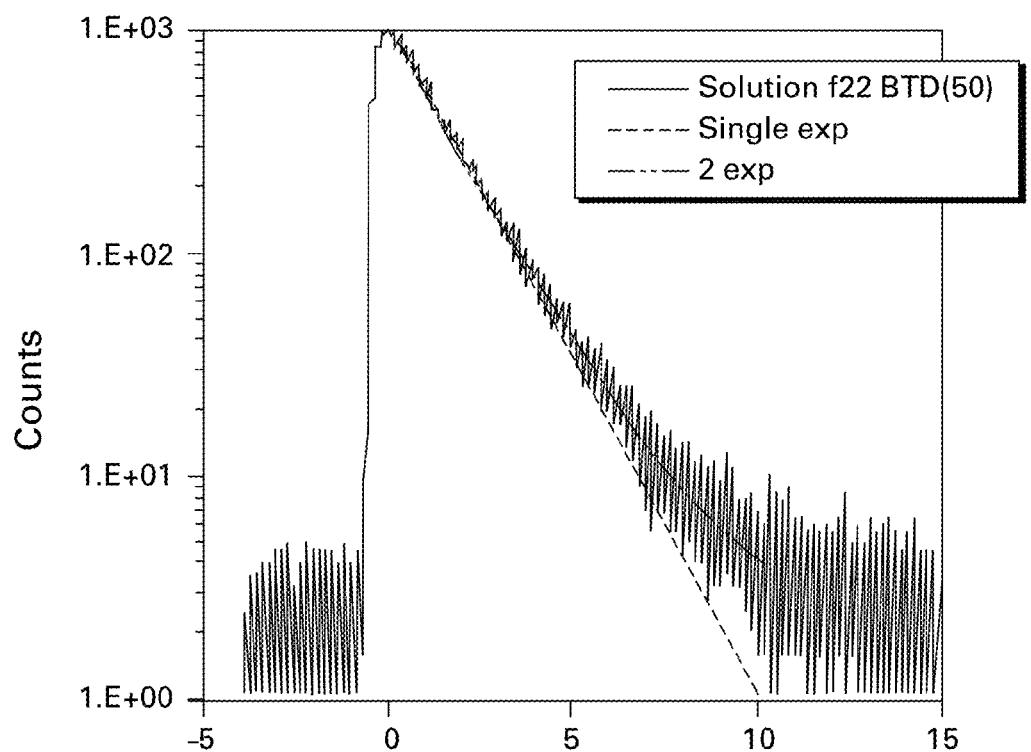
FIGS. 5A-5C are photoluminescence decay curves for films of polymers according to the present invention.
Figure 5B:
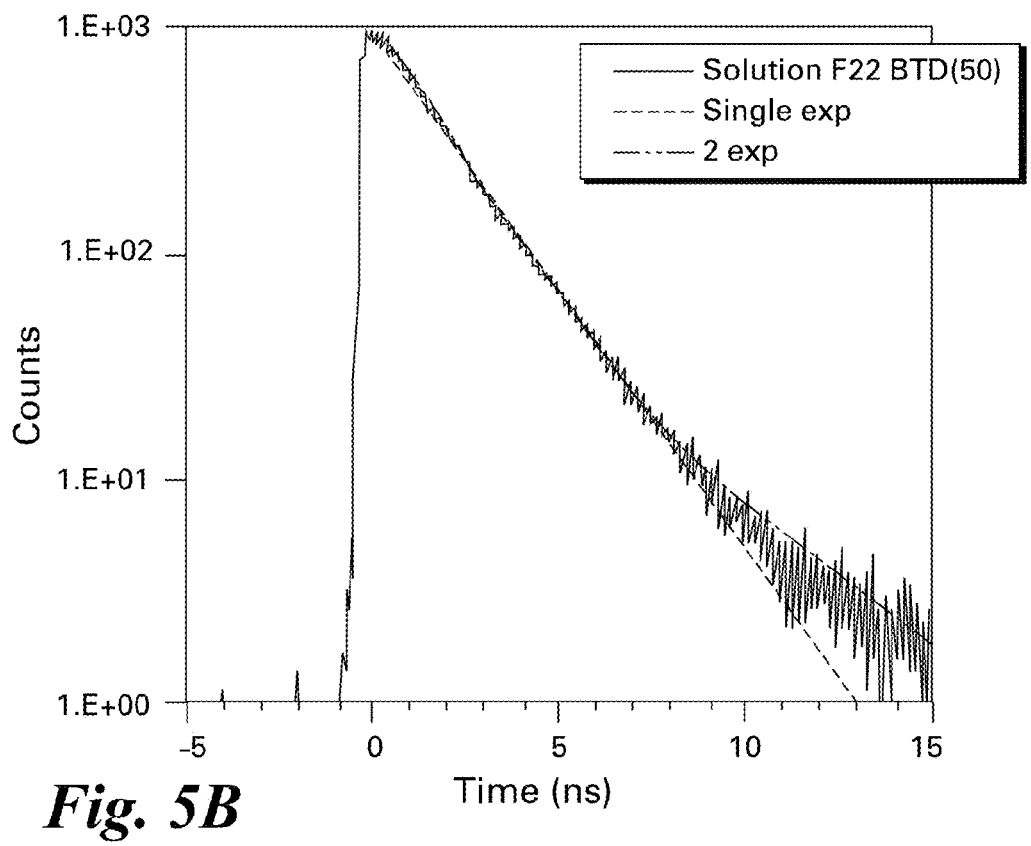
Figure 5C:
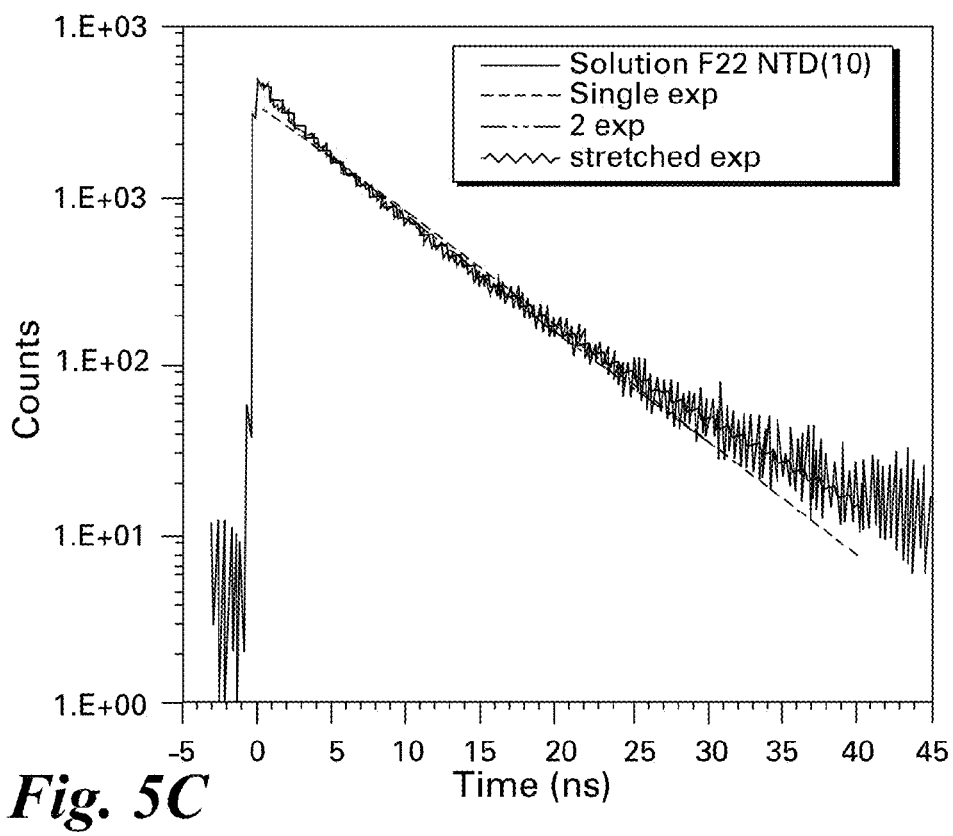

Time resolved decay from films of the polymer materials is shown in FIGS. 5A-5C. In some cases the fit to a single exponential function did not lead to fully satisfactory fits of the luminescence decay curves. This is typically indicative of multiple competing energy or charge transfer processes within the film or multiple emission sites. Deconvultion of these effects can be somewhat complicated. To enable future comparisons, we model the data on a phenomenological level using a two exponential form:

$$A(t)=C_1\exp(-t/\tau_1))+C_2\exp(-(t/\tau_2))$$

In one case (Example 7, F22-NTD-10) the stretched exponential fit is of the form:

$$A(t)=C\exp(-(t/\tau)^a)$$

This particular form has often been used to describe a sample that exhibits a large multiplicity of rate constants, and the fact the film data exhibits an improved fit using this function implies that there are interchain interactions that lead to energy migration between the chains. The fitted time constants appear in Table 4.

TABLE 4

| | Fit to luminescence lifetime data | |
|---|---|---|
| | Sample | single exp T |
| solution | F22-BTD-30 | 2.75 |
| | F22-NTD-10 | 9.24 |
| | F22-BSeD-30 | 2.4 |
| | F8-BTD50 | 2.28 |
| | F22-BTD10 | 3.11 |

Example 13

Time Resolved Decay of Energy and Charge Transfer to Other Materials

PVK obtained from Aldrich was purified via multiple precipitations from a concentrated solution of the polymer in methylene chloride (107 mg/ml) into boiling deionized water. The resulting precipitate was then dried in a vacuum oven (50 C.) for several days until no further weight loss was observed. Flrpic (Iridium (III) bis(2-(4,6-difluorophenyl)pyridinato-N, C2')picolinate, ADS 065BE) was used as received. Chlorobenzene was obtained from Aldrich and used as received. F8-BT was obtained from Sumation and used as received. Solutions of PVK, F8-BT and Flrpic (1% w/v) were each prepared in chlorobenzene in the laboratory ambient. A solution of Flrpic:PVK was prepared by mixing the respective 1% stock solutions in a 0.2:1 ratio. The 1% F8-BT solution was then added to the Flrpic:PVK solution to form a solution with the final concentration ratios of 0.1:0.2:1 of F8-BT:Flrpic: PVK. Solutions for spin coating of the other luminescent polymer materials mixed with Flrpic and PVK were prepared in a similar manner.

Figure 6:
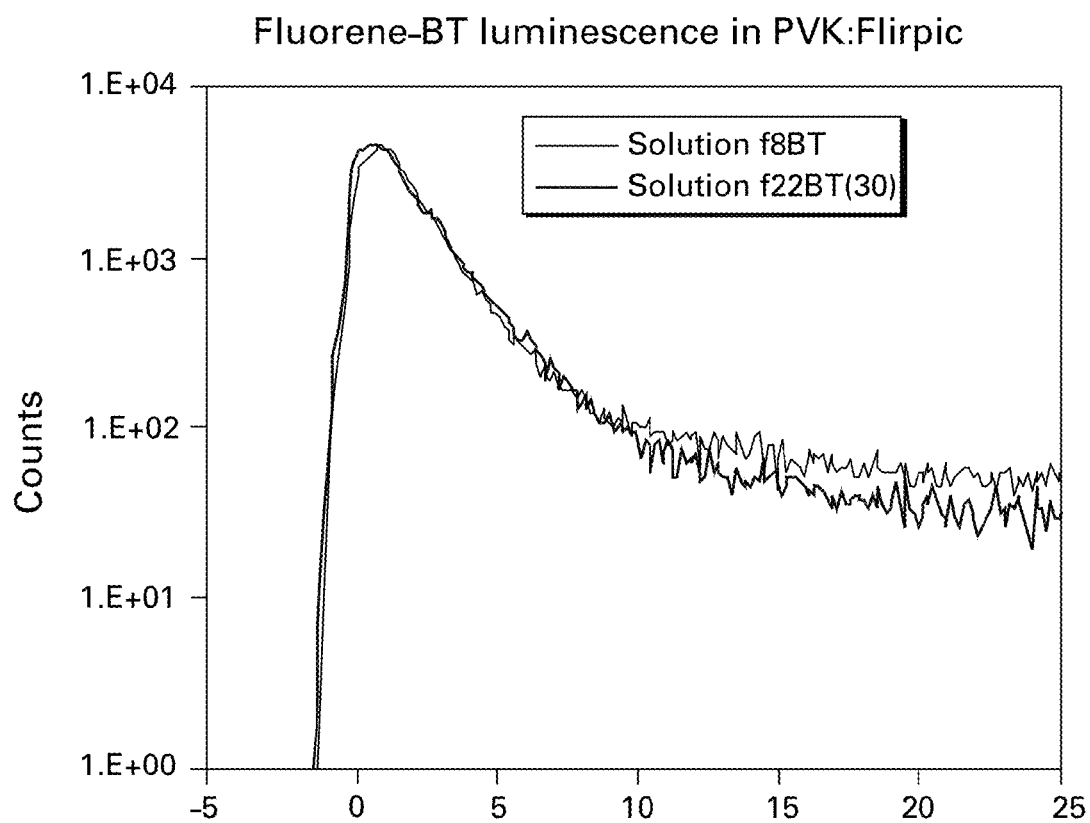
FIG. 6 is a graph comparing time resolved emission spectra of a polymer according to the present invention and a prior art polymer.

The time resolved emission spectra of F8-BT(50) and F22-BT(30) are shown in FIG. 6, and results are summarized in Table 5. Fitting the early time decay (0.5 ns-5 ns) to a single exponential results in a time constant of 1.54 ns for the F8-BTD(50) and 1.87 ns for the F22-BTD(30). These time constants are very similar to those obtained from the neat films and thus we do not observe any significant degree of charge transfer quenching from the polymer to the host material.

TABLE 5

| | Ex. No. | | Single-exp T | exp 1 | exp 2 | τ1 | a |
|---|---|---|---|---|---|---|---|
| Film | 4 | F22-BTD-30 | 1.87 | 1.582841 | 4.204022 | | |
| | 3 | F22-BTD-10 | 3.01 | 1.168537 | 3.192518 | | |
| | 7 | F22-NTD-10 | 6.42 | 1.811961 | 6.618591 | 3.924903 | 0.769581 |
| | — | F8-BTD-50 | 1.54 | 1.385902 | 3.934664 | | |
| PVK | 4 | F22-BTD-30 | 1.89 | | | | |
| | — | F8-BTD-50 | 1.64 | | | | |

All time constants are in units of ns.

Example 14

OLED Devices Constructed Using Polymers with Long Carbon Side Chains

The substrate for the devices consisted of patterned ITO (80 nm-120 nm) thickness on a thin (~0.7 mm) 1"×1" piece of glass. The cleaning steps following a photolithography process typically result in a clean surface, and thus the substrates only required modest cleaning prior to OLED fabrication. On occasion, to ensure that all residual organic materials such as photoresist are removed, an additional rinse with acetone on all substrates in 5-minute sonic bath in acetone was performed. Once the photoresist had been removed, the ITO substrates were fully submerged in isopropanol (research grade) using a Teflon processing boat to hold the substrates and placed in an ultrasonic bath for 10 min. Following the 10 min sonic bath in isopropanol, each substrate was removed from the isopropanol bath and individually blown dry with nitrogen. The substrates were inspected to ensure that there was no staining on the ITO substrate due to solvent residue and no particles visible on the surface. A 10 min UV/Ozone treatment was used for the final surface cleaning/treating step Following substrate preparation, Hole Injection Layer (HIL) was deposited on the cleaned substrates. UV-Ozone treated ITO tends to evolve over time, thus this step is performed soon after cleaning is complete. This layer has two principle functions, it both smoothes the ITO layer and it promotes hole injection from the ITO into the active layers. At present, there are a variety of HILs from a number of vendors to choose from that can be used. In the devices build here, a prepared solution of PEDOT:PSS (HC Stark CH8000) was used. Following deposition of the Hole injection layer, the coated substrates were baked, in air, at 130 C.

Following deposition of the HIL, a polyfluorene—triaryl amine copolymer F8-TFB containing 50% F8 fluorene and 50% TFB units, obtained from Sumation, was deposited. The polymer is soluble in toluene and xylenes, and a 0.5% (5 mg/mL) of TFB in toluene as the coating solution was used. Very little or no heating of the solution was necessary to dissolve TFB in toluene at this concentration. Following deposition of this solution via spin coating in a nitrogen atmosphere, the samples were baked for ½ hour in a nitrogen atmosphere at 170 C.

Solutions of the emissive polymer were then deposited via spin coating on the F8-TFB coated substrates. These solution were typically 1.1% w/v (11 mg/ml) in concentration in toluene. The materials were deposited, via spin coating, in a nitrogen atmosphere using spin speeds of about 1000 rpm. Following deposition of the layers the samples were baked under nitrogen for ½ hour at 130C. Following the bake procedure, the samples were loaded into a bell jar evaporator. The evaporator was pumped to a pressure of >3×10$^{-6}$ torr and then a thin layer of potassium fluoride (nominal thickness <5 nm) followed by a thick (>100 nm) aluminum layer was deposited. The devices were then sealed with a UV curable adhesive and removed from the nitrogen atmosphere for testing.

Devices were constructed using three different polymer materials as the emissive layer, F22-BTD10, F22-BseD10, F22-NTD10. Devices constructed with each of the emissive materials exhibited electro-luminescence upon the application of an applied voltage with a measured external quantum efficiency, eqe, (defined as the ratio of photons emitted by the number of electrons injected) varies between ~0.2% and ~1.5%. The spectra were measured in the range of 400 nm-750 nm using a calibrated Spectra Scan PR705 spectrometer (Photo Research). Table 6 reports the measured maximum eqe of the OLED device along with the calculated average emission wavelength using the spectral data in the range of 400 nm-750 nm.

TABLE 6

| Polymer | eqe maximum | Average wavelength (nm) |
|---|---|---|
| F22-BSeD | 0.29% | 592 |
| F22-NTD | 0.19% | 629 |
| F22-BTD | 1.50% | 558 |

Figure 7:
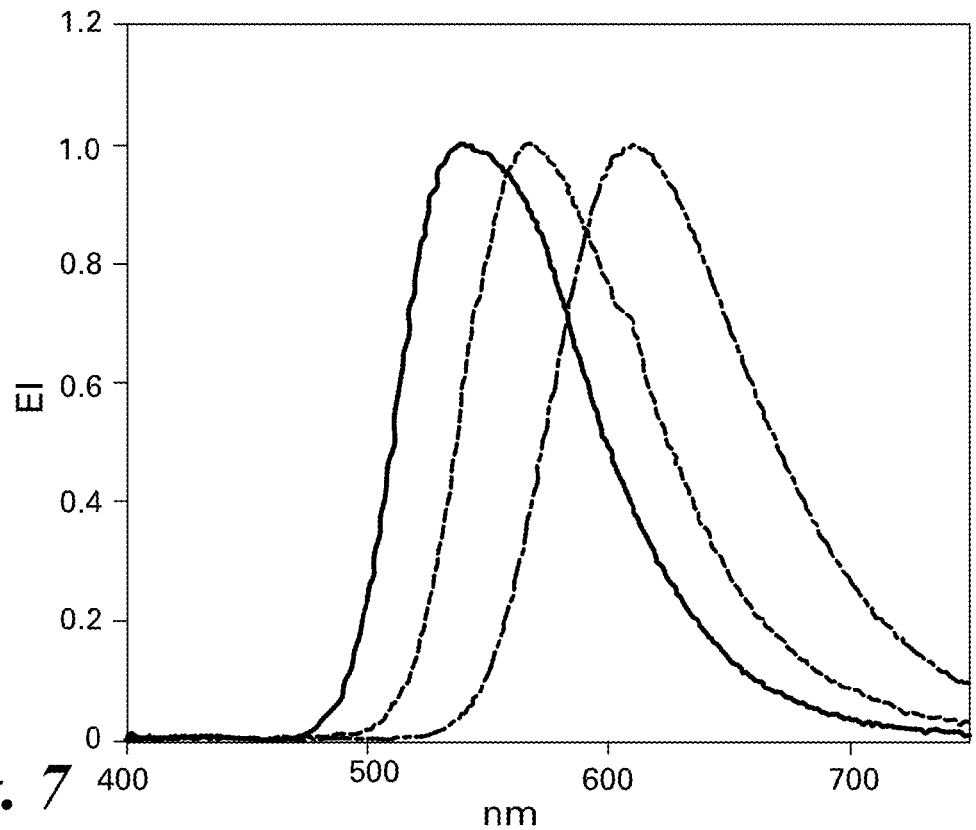
FIG. 7 is a graph showing measured electroluminescence spectra for optoelectronic devices according to the present invention.

The measured electroluminescence spectra for devices built using the three different materials is shown in FIG. 7.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An optoelectronic device having an electroluminescent layer comprising a polymer comprising structural units of formula I and II

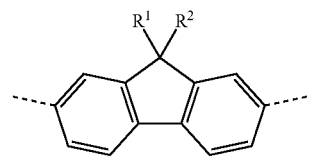

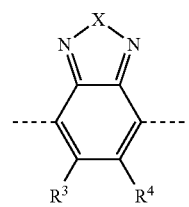

wherein
R$^1$ and R$^2$ are independently Ar—(OCH$_2$CH$_2$(CH$_2$)$_m$)$_n$OCH$_3$;
R$^3$ and R$^4$ are independently H, C$_{1-44}$ hydrocarbyl or C$_{1-44}$ hydrocarbyl containing one or more S, N, O, P, or Si atoms, or R$^3$ and R$^4$, taken together, form a C$_{2-10}$ monocyclic or bicyclic ring containing up to three S, N, O, P, or Si heteroatoms;
X is S, Se, or a combination thereof;
m is 0 or 1; and
n ranges between about 20 and about 500.

2. An optoelectronic device according to claim 1, wherein X is S.

3. An optoelectronic device according to claim 1, wherein X is Se.

4. An optoelectronic device according to claim 1, wherein the structural unit of formula I is

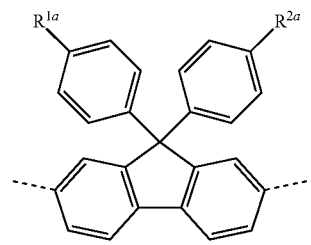

wherein R$^{1a}$ and R$^{2a}$ are independently —(OCH$_2$CH$_2$(CH$_2$)$_m$)$_n$OCH$_3$.

5. An optoelectronic device according to claim 1, wherein the structural unit of formula I is

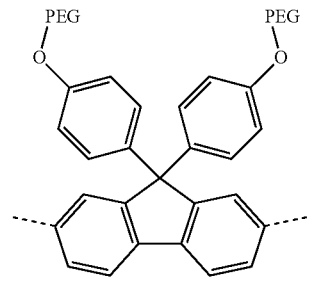

wherein
PEG is —CH$_2$CH$_2$(OCH$_2$CH$_2$)$_n$OCH$_3$; and
n ranges between about 20 and about 100.

6. An optoelectronic device according to claim 1, wherein the structural unit of formula II is

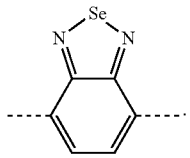

7. An optoelectronic device according to claim 1, wherein the structural unit of formula II is

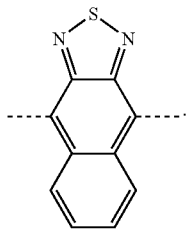

8. An optoelectronic device according to claim 1, wherein the structural unit of formula II is

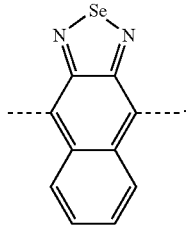

9. An optoelectronic device according to claim 1, additionally comprising an iridium-containing organometallic compound.

10. An optoelectronic device according to claim 9, wherein the iridium-containing organometallic compound is blended with the polymer.

* * * * *